(12) United States Patent
Loo et al.

(10) Patent No.: US 6,946,332 B2
(45) Date of Patent: Sep. 20, 2005

(54) FORMING NANOSCALE PATTERNED THIN FILM METAL LAYERS

(75) Inventors: Yueh-Lin Loo, Princeton, NJ (US); John A. Rogers, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 194 days.

(21) Appl. No.: 10/098,202

(22) Filed: Mar. 15, 2002

(65) Prior Publication Data

US 2003/0175427 A1 Sep. 18, 2003

(51) Int. Cl.$^7$ .......................... H01L 21/00; H01L 21/84
(52) U.S. Cl. .................. 438/149; 438/158; 438/586; 438/608; 438/616; 438/666; 438/669; 438/670; 438/671; 438/674; 438/677; 438/685; 438/686
(58) Field of Search ................... 438/149, 158, 438/161, 585–587, 597–599, 608, 616, 618, 621, 666, 669–671, 674, 677, 685–686

(56) References Cited

U.S. PATENT DOCUMENTS

| | | | | |
|---|---|---|---|---|
| 6,294,401 B1 | * | 9/2001 | Jacobson et al. | 438/99 |
| 6,410,416 B1 | * | 6/2002 | Dodabalapur et al. | 438/615 |
| 6,596,569 B1 | * | 7/2003 | Bao et al. | 438/151 |
| 2002/0084252 A1 | * | 7/2002 | Buchwalter et al. | 216/44 |
| 2002/0130605 A1 | * | 9/2002 | Mueller et al. | 313/310 |
| 2002/0148113 A1 | * | 10/2002 | Forrest et al. | 29/847 |
| 2004/0033641 A1 | * | 2/2004 | Yang et al. | 438/99 |

* cited by examiner

*Primary Examiner*—Lynne A. Gurley

(57) ABSTRACT

The specification describes a contact printing technique for forming patterns of thin films with nanometer resolution over large areas. The procedure, termed here "nanotransfer printing (nTP)", relies on tailored surface chemistries for transferring thin films, typically metal films, from the raised regions of a stamp to a substrate when these two elements are brought into intimate physical contact. This technique is purely additive, it is fast (<15 s contact times), and the printing occurs in a single processing step at room temperature in open air. nTP is capable of producing patterns with a wide range of features with sizes down to ~100 nm, and edge resolution better than 25 nm. Electrical contacts and interconnects have been fabricated for high performance organic thin film transistors (TFTs) and complementary inverter circuits, to demonstrate one of the many potential applications for nTP.

26 Claims, 7 Drawing Sheets

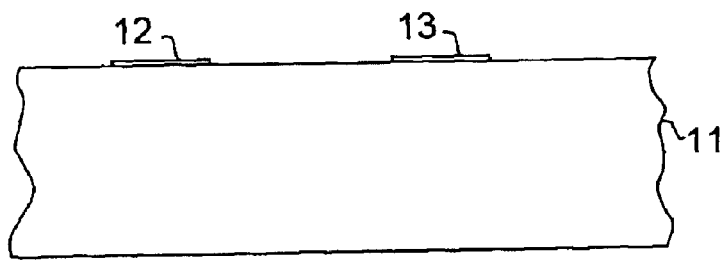
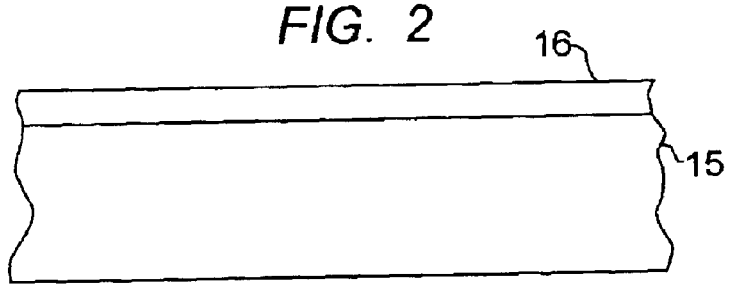
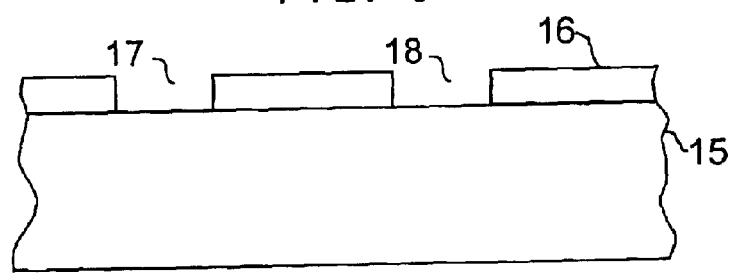
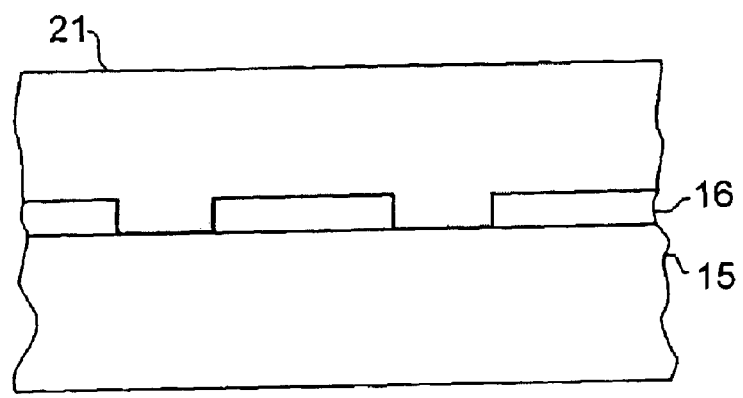

FORMING NANOSCALE PATTERNED THIN FILM METAL LAYERS

FIELD OF THE INVENTION

This invention relates to nanoscale patterning of metal films, and more particularly to patterning of metal films using surface chemistry mediated transfer processes.

BACKGROUND OF THE INVENTION (The following section contains background material that, unless specifically stated otherwise, may or may not be prior art).

Advanced techniques for nanofabrication are in widespread use for research in biology, physics, chemistry and materials science. They are also essential manufacturing tools for electronics, photonics and many other existing and emerging areas of technology. Established nanolithographic methods (e.g., electron-beam lithography, deep ultraviolet photolithography, etc.) require elaborate and expensive systems that are capable only of patterning a narrow range of specialized materials over small areas on ultraflat surfaces of rigid inorganic substrates. These limitations and the importance of nanofabrication to progress in nanoscience and technology have created substantial interest in alternative techniques, such as those based on forms of contact printing, molding, embossing, and writing. See for example, C. A. Mirkin and J. A. Rogers, MRS Bull. 26, 530 (2001); B. Michel et al., IBM J. Res. & Dev. 45, 697 (2001); Y. Xia, J. A. Rogers, K. E. Paul, and G. M. Whitesides, Chem. Rev. 99, 1823 (1999). Although the basic operating principles of these techniques are conceptually old, recent research demonstrates that their resolution can be extended into the micron and nanometer regime by combining them with advanced materials and processing approaches. For example, elastomeric stamps and selfassembled monolayer inks (see L. H. Dubois and R. G. Nuzzo, Ann. Rev. Phys. Chem. 43, 437 (1992)) form the basis of a relatively new high-resolution printing technique. See A. Kumar and G. M. Whitesides, Appl. Phys. Lett. 63, 2002 (1993) and Y. Xia and G. M. Whitesides, Angew. Chem. Int. Ed. 37, 550 (1998). This method, known as microcontact printing ($\mu$CP), is rapidly becoming important for a range of applications in biotechnology, (J. Hyun, Y. J. Zhu, A. Liebmann-Vinson, T. P. Beebe, and A. Chilkoti, Langmuir 17, 6358 (2001)) plastic electronics, (J. A. Rogers, Z. Bao, K. W. Baldwin, A. Dodabalapur, B. Crone, V. R. Raju, V. Kuck, H. E. Katz, K. Amundson, J. Ewing, and P. Drzaic, Proc. Natl. Acad. Sci. USA, 98, 4835 (2001); J. A. Rogers, Science 291, 1502 (2001)) and fiber optics (J. A. Rogers, R. J. Jackan, G. M. Whitesides, J. L. Wagener, and A. M. Vengsarkar., Appl. Phys. Left. 70, 7 (1997)) where the relevant patterning requirements cannot be satisfied easily with conventional methods. Although the resolution of $\mu$CP is only ~0.25 $\mu$m, this method and other emerging printing techniques, such as those that rely on imprinted polymer resists ("Imprint lithography with 25-nanometer resolution" Chou S Y, Krauss P R, Renstrom P J, SCIENCE 272 (5258): 85–87 Apr. 5, 1996)) and cold welded metals, have characteristics that make them potentially attractive for nanolithography: they offer fast, low-cost approaches for patterning flat or curved surfaces over large areas in a single processing step. While these methods appear to be useful for a range of applications, they are all generally subtractive in their operation: they either pattern sacrificial resists or they remove selected regions of an existing layer of material.

BRIEF STATEMENT OF THE INVENTION

This invention is an additive printing method that has high resolution. The method, termed here "nanotransfer printing (nTP)", involves four components: (i) a stamp (rigid, flexible, or elastomeric) with relief features in the geometry of the desired pattern, (ii) a method for depositing a thin layer of material onto the raised features of this stamp, (iii) a method for bringing the stamp into intimate physical contact with a substrate and (iv) surface chemistries that control adhesion of the deposited material(s) to the stamp relative to the adhesion to the substrate. In some embodiments, the bonding surface chemistry relies on the hydroxyl (—OH) groups on the surface oxide of a metal and those on a substrate. This chemistry is produced by plasma treatment of the surfaces to be bonded, and can be used either to pattern the surface oxide-forming metal itself or to pattern other metals bonded to it (e.g. noble metals, etc.). This printing approach is capable of producing nanometer resolution for a wide range of patterns in a parallel fashion over large areas. Patterns are typically characterized by features in the range 0.05–100 $\mu$m, in fine patterns below 20 microns, and edge resolution of better than 100 nm., and in fine patterns, better than 150 angstroms.

nTP is particularly useful for printing metal conductor patterns (metallization) and device features on flexible polymer substrates in, for example, thin film transistor (TFT) technology. It may also be used for printing materials other than elemental metals, for example, indium tin oxide, TaN.

BRIEF DESCRIPTION OF THE DRAWINGS

FIGS. 1–11 are schematic representations of process steps useful for forming thin patterned metal layers using the method of the invention;

DETAILED DESCRIPTION

Figure 5:
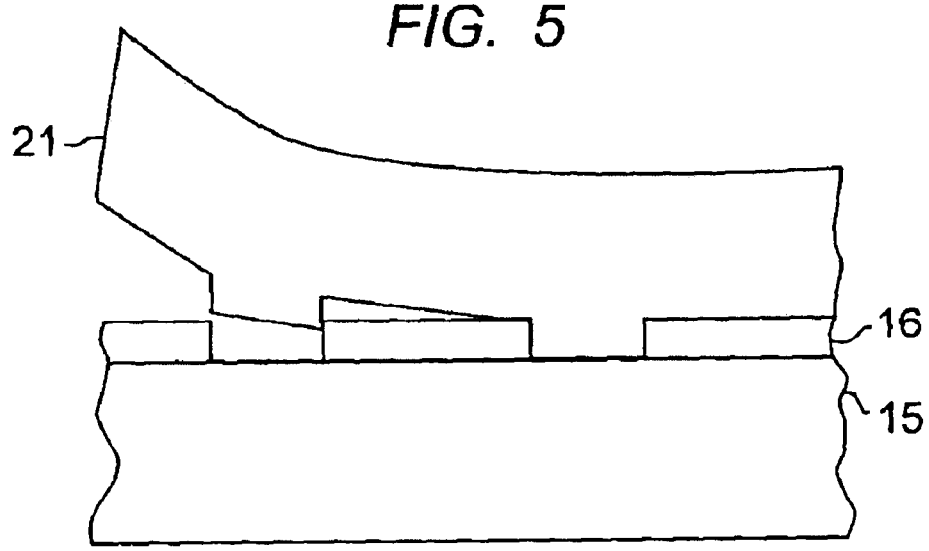
Figure 6:
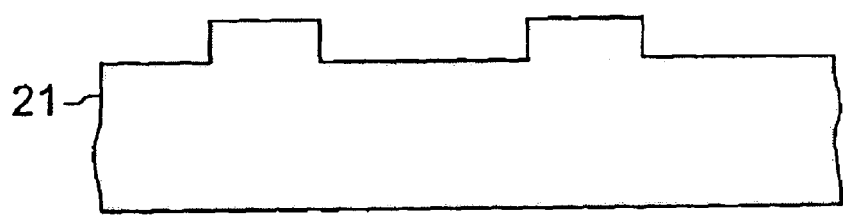

The method of the invention involves procedures for using nTP with both elastomeric (i.e. conformal) as well as rigid stamps to pattern thin metal films on both conformal and rigid substrates. For purposes of illustration, the method will be described in the context of its application to plastic electronic systems by fabricating drain and source electrodes and appropriate interconnects for high performance n- and p-channel organic transistors and complementary inverter circuits. Typical steps of the nTP method itself will be described with the aid of FIGS. 1–11. FIG. 1 shows the objective of this example. Flexible polymer substrate 11 is shown with source and drain electrodes 12 and 13 formed on the surface of the substrate by nTP. These electrodes are shown by way of example of other TFT features that can be produced by the method of the invention, or other metallized patterns useful in a wide range of applications as described earlier.

The nTP method begins with fabrication of a suitable stamp. For illustration, the fabrication of an elastomeric stamp, i.e. a flexible stamp, will be described. It will be understood that the formation of a rigid stamp may follow similar steps. It is also understood that the invention applies to all of the permutations described above, i.e. 1. a flexible stamp with a rigid substrate, 2. a flexible stamp with a flexible substrate, 3. a rigid stamp with a flexible substrate, and 4. a rigid stamp with a rigid substrate. For the manufacture of flexible TFT assemblies, to be described in more detail below, the combinations 2. and 3. are preferred.

The elastomeric stamp was formed by casting a prepolymer of poly(dimethysiloxane) (PDMS) against a pattern of photoresist on a silicon wafer. FIG. 2 shows silicon substrate 15, with a coating 16, typically a spin coating, of conventional photoresist applied to the surface of the substrate. An advantage of this aspect of the method of the invention is that highly developed silicon technology can be used in forming the master pattern for the stamp.

FIG. 3 shows the photoresist layer 16 patterned with openings 17 and 18 corresponding to the source and drain contacts. The thickness of the photoresist layer will determine the approximate relief ratio for the stamp. A raised pattern having a relief dimension of at least twice the thickness of the metal film being printed is preferred. The depth of the relief pattern will determine the approximate number of printing operations that can be performed without clearing the features in the stamp. If the relief is very deep, printing resolution may be affected and pattern distortion may occur. It is preferred that the relief, i.e. the depth of the features, or the thickness of photoresist layer 16 in FIG. 3, be from 2–20 times the thickness of the metal pattern being printed. In TFT technology, the metal patterns are typically in the range 0.05 to 2 microns in thickness, and for flexible TFT applications, less than 1 micron is preferred.

The overall stamp dimensions will typically be between 0.1–10 cm. The pattern is typically characterized by features in the range 0.05–100 $\mu$m, in fine patterns below 20 microns, and edge resolution of better than 100 nm., and in fine patterns, better than 150 angstroms.

FIG. 4 shows the casting step. In the demonstration of the invention described here, a prepolymer layer 21 of poly (dimethysiloxane) (PDMS) was cast against the patterned layer 16. Sylgard 184 (Dow Corning; A:B=1:10) silicone elastomer was used as received. The degassed prepolymer mixture was cured at 75° C. for several hours. The fully cured polymer was then peeled back, as shown in FIG. 5, to yield a stamp, FIG. 6, that replicates the master in reverse tone. The stamp is shown here as a single layer of elastomer. For handling, and for added rigidity that may be desired for handling, the cast elastomer body may be attached to a flexible polymer substrate such as of poly(ethylene terephthalate) (PET). A suitable range for the overall thickness of the elastomer layer is 0.5 to 100 microns. The elastomer backing layer, e.g., PET, may have a thickness in the range 50–500 microns. For more details, of the formation of suitable substrates see copending application Ser. No. 10/098,201 which is incorporated herein by reference. This application also describes in more detail suitable classes of materials for the flexible substrates. The same classes of flexible materials may be used for the stamp material.

The layer 16, against which the flexible layer 21 is cast, may also be formed using other materials. For example, a silicon substrate with a grown oxide layer may be patterned using lithography, thereby forming the structure shown in FIG. 3. A mold release material or layer may be deposited, if needed, to facilitate the peeling step of FIG. 5. Advantages of this option are the high degree of control over the thickness of layer 16 that is easily obtained using oxide growth on silicon, and the ease and control with which re-entrant sidewalls can be produced. Since the molded layer is flexible and resilient, it releases easily from a suitably prepared mold. Other substrate materials, for example, silicon on sapphire, may be used. Substrates like this are widely available in semiconductor technology, and techniques for making precise patterns with fine lines and vertical or re-entrant sidewalls are well developed.

Wholly rigid stamps may be prepared for example by the steps of (i) patterning resist (e.g. electron beam resist or photoresist) on a substrate (e.g. glass or GaAs), (ii) etching the exposed regions of the substrate with an anisotropic reactive ion etch and (iii) removing the resist with acetone. The substrate materials mentioned are chosen for their adhesion properties (see below).

For these types of stamps, the lithography and the etching steps can be controlled to yield features of relief with nearly vertical or slightly re-entrant sidewalls. For reasons that will become apparent, re-entrant sidewalls may be an advantage. As evident from the above, the use of a rigid stamp material facilitates the production of re-entrant sidewalls. These are easily produced by adjusting the parameters of the etching or developing operation, using known methods of anisotropic plasma etching.

An attractive alternative to all flexible or all rigid stamps is to fabricate the stamp using a flexible layer formed on a rigid substrate. This facilitates handling and maintains the desired conformal quality of the stamp surface.

The next step in forming the stamp is to apply an easily removable, i.e. transferable, metal layer to the surface of the stamp. An important feature of the invention is to provide a metal coating in this step that adheres only moderately to the stamp surface, so that it adheres during handling, but is easily released later on. One such coating is gold, which adheres very poorly to PDMS (or GaAs or glass). Accordingly, gold is preferred as a release layer for the metal being stamped. The metal chosen for the primary thin film layer is preferably a metal that can be activated for good adhesion. Activation in this context means the forming of surface reactants that will produce a chemical bond by a condensation reaction with surface species on a suitably prepared substrate. Noble metals, such as gold, are generally not desirable for this purpose. A preferred metal is titanium. Other suitable metals are Al, Ni, or composite thin film layers of two or more metals. In this case noble metals may be chosen for one or more of the composite layers.

Figure 7:
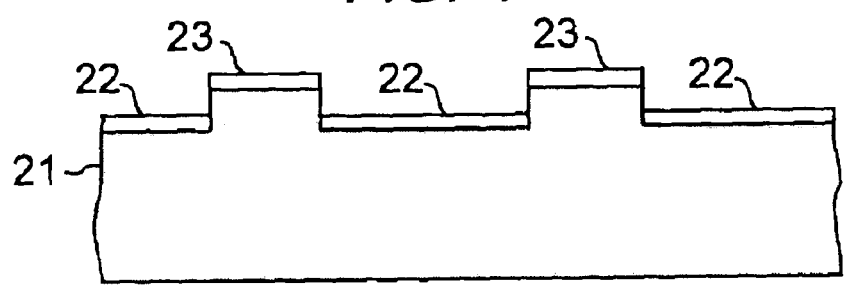

In the example given here, a bi-layer of Au (20 nm; 1 nm/s) and Ti (5 nm; 0.3 nm/s) Au—Ti is deposited on the surface of the stamp by electron beam evaporation as shown in FIG. 7. A vertical, collimated flux of metal from the source ensures uniform deposition only on the raised regions 23 and recessed regions 22 of relief on the stamps (i.e. not on the sidewalls). The gold adheres poorly to the surfaces PDMS, glass and GaAs. The Ti layer serves two purposes: (i) it promotes adhesion between the Au layer and the substrate after pattern transfer, and (ii) it readily forms a ~3 nm oxide layer under ambient conditions which provides a surface where the condensation reaction can take place.

Figure 8:
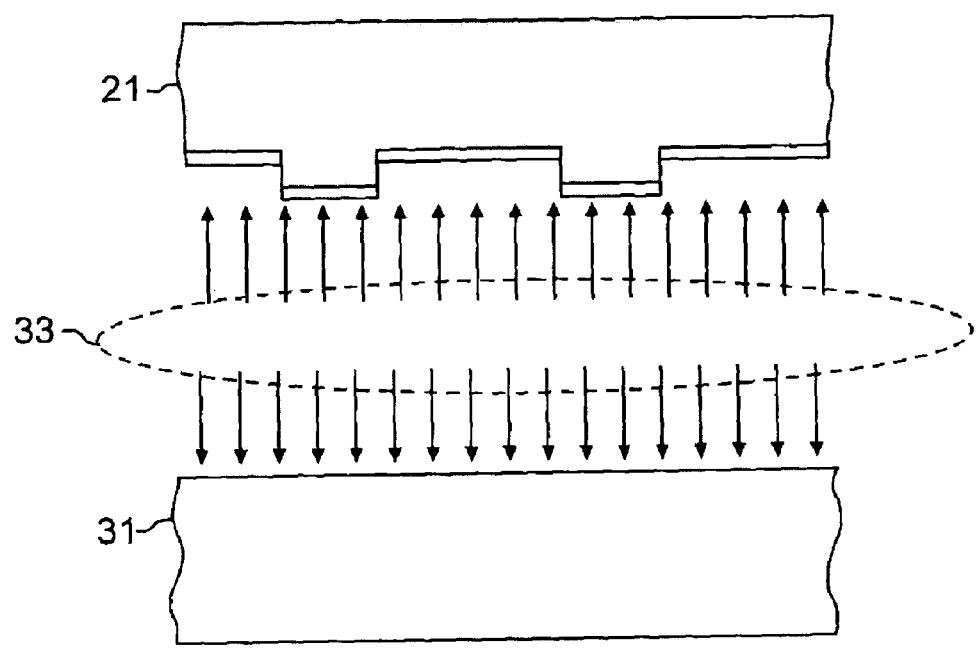

With reference to FIG. 8, the titanium oxide (TiOx) surface on substrate 21 is exposed to an oxygen plasma 33

(and subsequently to air). For demonstration, a PlasmaTherm reactive ion etcher was used with an oxygen flow rate of 30 cm$^3$/min and a pressure of 30 mtorr at 100 V. The stamp (substrate 21) was first exposed to the oxygen plasma for 4 minutes. The device substrate (substrate 31) was then placed in the chamber, and both the stamp and device substrate were oxidized for an additional 5 seconds.

Figure 9:
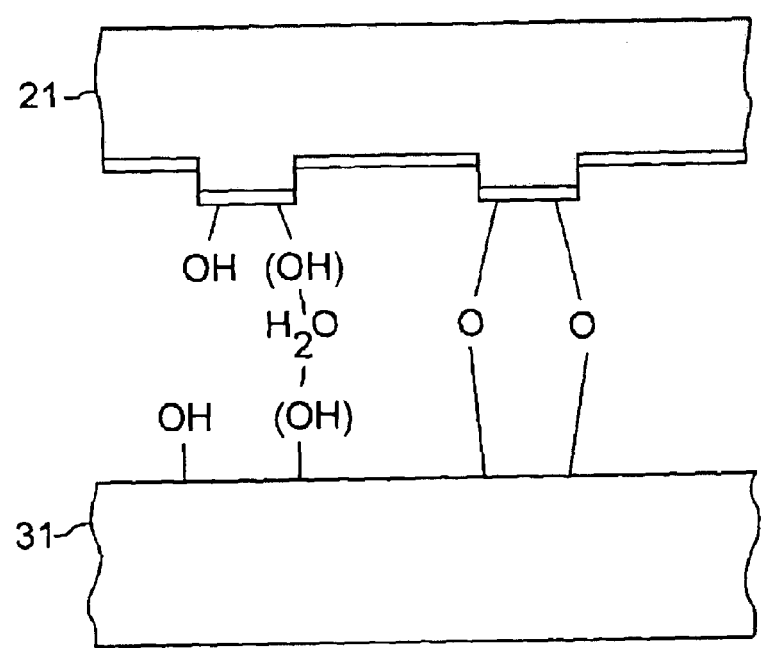

This results in the formation of hydroxyl (—OH) groups (titanol) on the surface as indicated in FIG. 9. and effectively removes adsorbed hydrocarbons from the surface. Although this treatment has been demonstrated empirically to be effective, we theorize that plasma oxidation is analogous to exposing the titanium oxide surface to ultraviolet light in air: it breaks bridging oxygen bonds, thereby creating defect sites where water molecules can adsorb.

In this example, conformal substrate, 31 in FIGS. 8 and 9, is designed for the TFT laminated plastic circuit described below. The substrate 31 consists of thin films of PDMS (10–50 $\mu$m thick) cast on 6 sheets of poly(ethylene terephthalate) (PET; 175 $\mu$m thick). See application Ser. No. 10/098,201 referenced earlier. Exposing the PDMS to an oxygen plasma (FIG. 8) (and subsequently air) produces surface (—OH) groups (silanol) as shown in FIG. 9.

Figure 10:
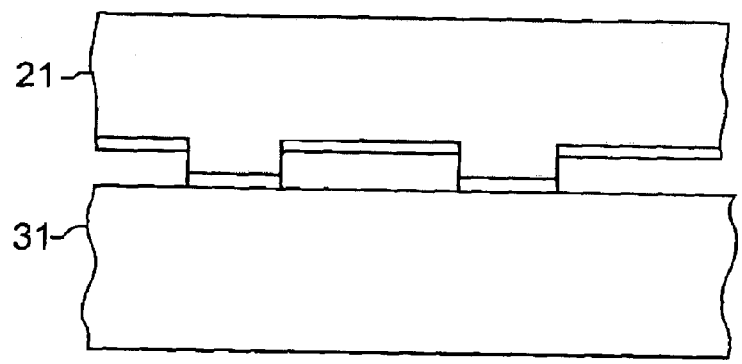
Figure 11:
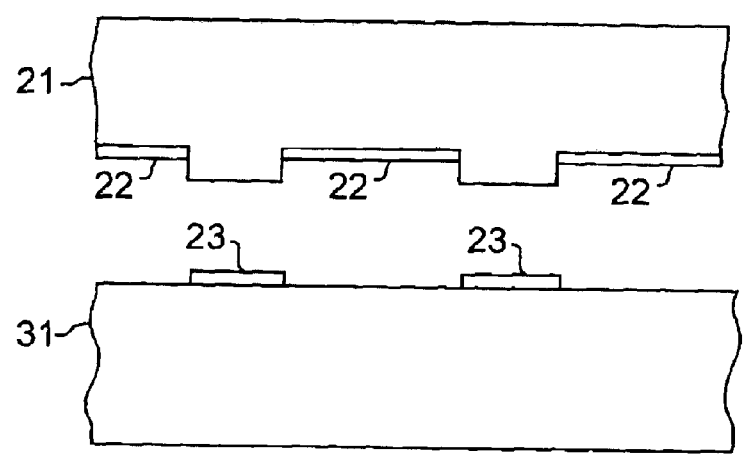

Placing the plasma oxidized, metal-coated stamp 21 (either a PDMS stamp or a hard stamp) on top of substrate 31 (or vice versa), as shown in FIG. 10, leads to intimate, conformal contact between the raised regions of the stamp and the substrate, without the application of any external pressure. As shown in FIG. 9, it is believed that a condensation reaction takes place at the (—OH)-bearing interfaces during contact; which results in permanent Ti—O—Si bonds, and produces strong adhesion between the two surfaces. This chemistry is commonly used in sol-gel processes, and is also similar to that recently exploited for bonding plies of laminates for TFT tapes. (See the patent application referenced above.) Peeling the substrate and stamp apart transfers the Au/Ti bi-layer from the raised regions of stamp (to which the metal has poor adhesion) to the substrate as shown in FIG. 11.

Patterns of Al, which readily form surface oxides, may also be transferred using the same technique and conditions. Complete pattern-transfer from a PDMS stamp to a PDMS/PET substrate occurs readily at room temperature in open air with contact times of less than 15 seconds. When a rigid stamp is employed, heating at ~85° C. for ~30 seconds facilitates printing. It is also possible to print with rigid and elastomeric stamps onto rigid substrates (e.g., $SiO_2$ surfaces) using similar procedures. In these cases, however, external pressure may be required to bring the stamp into full contact with the substrate.

Aside from its purely additive nature, nTP has another advantage over conventional nanolithographic techniques: the stamps employed in nTP are reusable, which makes this method an inherently low cost technique for nanofabrication. The stamps do, however, require occasional cleaning with a liquid etchant for the metals to prevent excessive buildup of material in the recessed regions.

To demonstrate a potential application for nTP in plastic electronics, we patterned features of Au/Ti on PDMS/PET in the geometry of the drain and source level of TFT transistors and simple circuits that incorporate them. Over the last decade, IC technologies have been proposed that use organic semiconductor thin film transistors (TFTs). The chief attractions of such circuits stem from the anticipated ease of processing and compatibility with flexible substrates. These advantages are expected to translate into a low-cost IC technology suitable for applications such as smart cards, electronic tags, and displays. Thin metal conductor patterns and device features are essential elements in this technology. nTP is especially suitable for producing these patterns and features.

TFT devices are described in F. Garnier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., J. Applied Physics, Vol. 70(1), pp. 469–475; and G. Horowitz et al., Synthetic Metals, Vol. 42–43, pp. 1127–1130. The devices described in these references are based on polymers or oligomers as the active materials, in contrast with the amorphous silicon and polysilicon TFT structures that were developed earlier. The devices are typically field effect transistors (FETs). Polymer active devices have significant advantages over semiconductor TFTs in terms of simplicity of processing and resultant low cost. They are also compatible with polymer substrates used widely for interconnect substrates.

Figure 12:
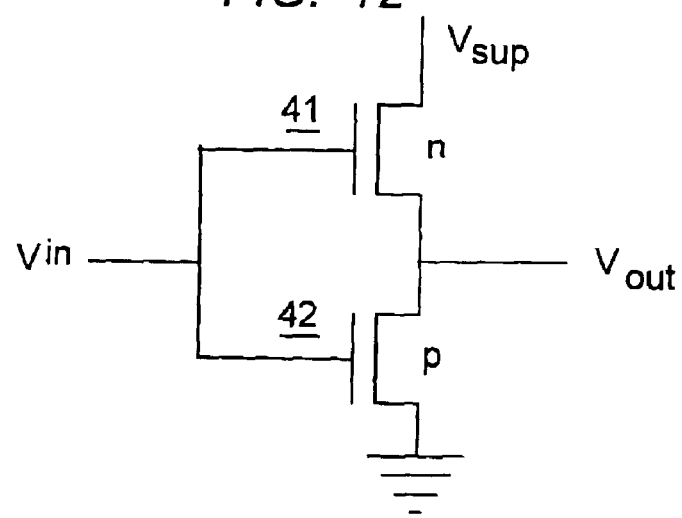
FIG. 12 is a circuit diagram of a simple TFT CMOS inverter used to demonstrate the effectiveness of the nTP method of the invention.

A simple TFT transistor circuit that may be fabricated using the method of the invention uses a TFT CMOS pair in the simple inverter circuit of in FIG. 12, where n-channel TFT is designated 41 and p-channel TFT is designated 42. The p-channel transistor may be used as driver for the n-channel load.

The inverter circuit of FIG. 12 may be fabricated by laminating the substrate 31 against a substrate that contains the remaining elements of the TFT, i.e. the gate structure and the semiconductor layer.

Figure 13:
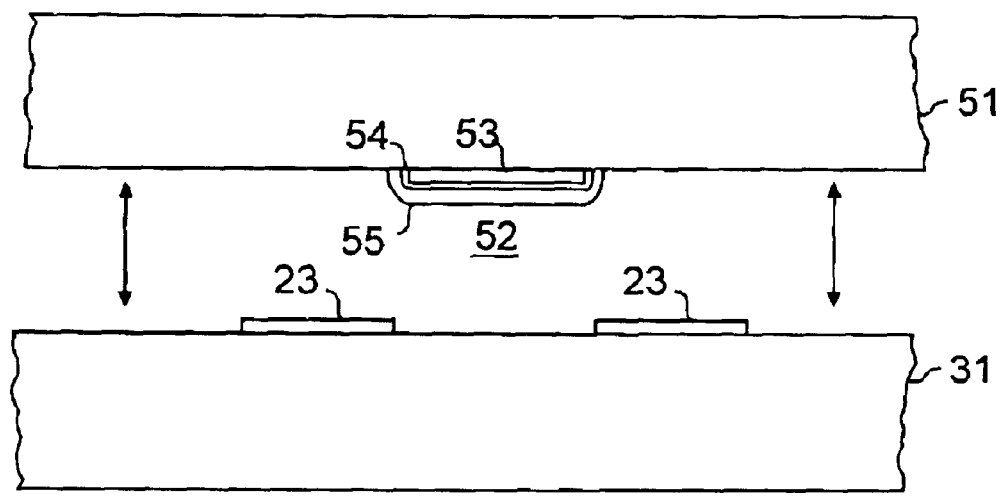
FIGS. 13 and 14 are schematic representations of process steps useful for forming a laminated TFT structure by the method of the invention.
Figure 14:
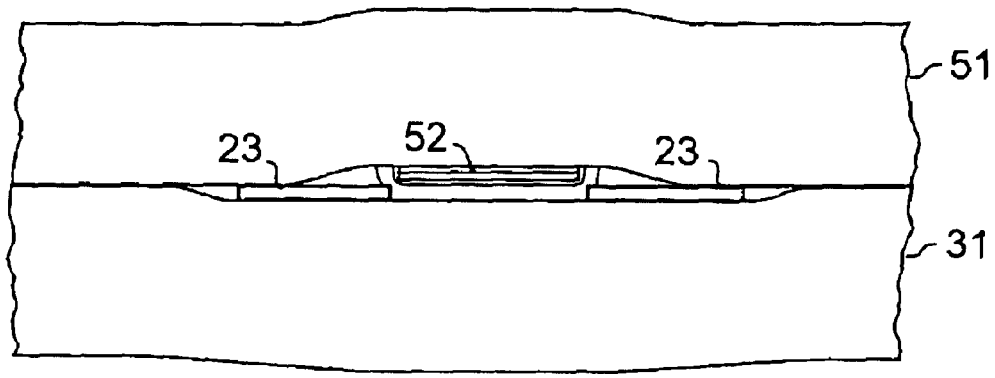

FIG. 13 illustrates this laminating operation. Substrate 51 supports the gate structure of the TFT, shown generally at 52. The gate structure includes the metal gate electrode 53, the gate dielectric 54, and the semiconductor layer 55. These elements are well known and need not be described in detail. The two substrates 31 and 51 are joined together by moderate pressure as described in more detail in the application referenced above.

It should be understood that the elements shown in the figures are not to scale. The thickness of the source/drain, gate, gate dielectric and semiconductor layers is shown exaggerated for clarity. These layers are thin films, as is evident from the overall description, that do not interfere with effective lamination of substrates 31 and 51 together as described.

An important feature of the invention is the use of a solid adhesive polymer layer materials as at least the surface layer of one or both of the substrates that are laminated together. The use of a solid adhesive polymer layer materials obviates the need for applying conventional liquid adhesive, and forms a laminate that is highly reliable.

Initiating contact at an edge by slightly bending one of the substrates, and then allowing contact to proceed gradually across the circuit provides a convenient way to laminate over large areas without creating trapped air pockets.

An important requirement for this lamination process is that the top substrate establishes conformal, atomic-scale contact with the bottom substrate. A layer of PDMS elastomer on the surface of either or both of substrates 31 and 51 is suitable as the solid adhesive polymer layer component for this process. It 'wets' the bottom substrate (over most of the substrate area, not shown in the figure) to enable this intimate contact without the use of external pressure to force the two parts together. Pressures of less than 50 psi, and in the preferred cases less than 10, psi are contemplated. This 'wetting' yields (i) efficient electrical contact of source/drain electrodes on the top substrate with semiconductor layers on the bottom substrate and (ii) strong interfacial siloxane bonds that form from a second dehydration reaction, in this case between the exposed hydroxyl groups on the two substrates (e.g. the PDMS and the glass resin for the top and bottom substrates, respectively). This single elastomer-based lamination step produces the circuit and simultaneously embeds it between the two sheets of PET without the use of conventional adhesives, and without the use of high temperatures. It also allows rapid bonding of the two flexible polymer substrates. The bonding feature may be defined as bonding with a solid adhesive polymer layer having an elastic modulus of less than 50 Mpa and a lamination frequency between 0.1–100 Hz.

Figure 15:
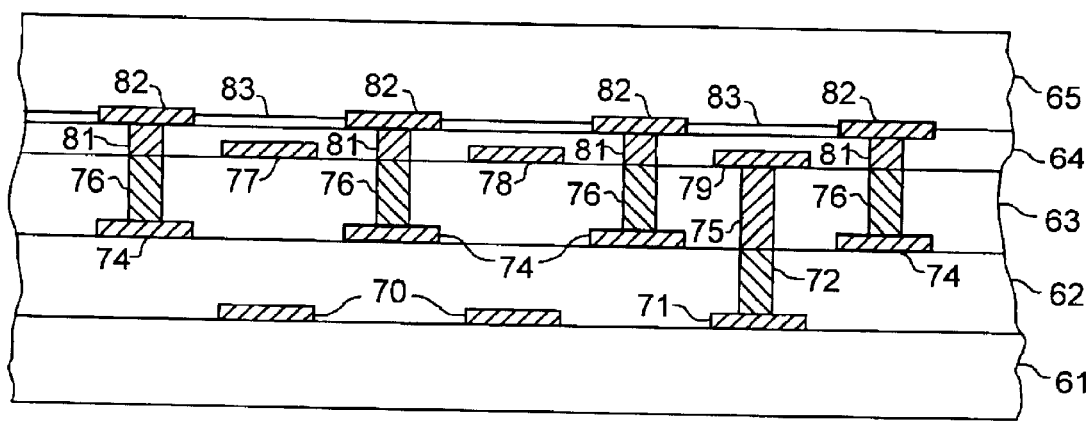
FIG. 15 is a schematic view of a multilevel laminated TFT structure that may be made according to the invention.

More than two plies may be used to add interconnect capability, or other circuit functions. An example is shown in FIG. 15 wherein five polymer plies 61, 62, 63, 64, and 65 are laminated together. Ply 61 has printed circuit 70 that includes contact pad 71 for a gate connection. Ply 62 has a printed circuit that includes contact pads 74, and via 72. Ply 63 has printed circuit 78, MOS gates 77 and 79, via 75 that connects via 72 with gate 79, and vias 76. Ply 64 contains source/drain electrodes 82, and vias 81 for connecting vias 76 in ply 63 with the source/drain contacts. Ply 65 contains semiconductor layers 83 on the bottom surface and serves to complete and seal the circuit. Each of plies 61–65 either contains a solid adhesive polymer layer on one or both surfaces, or it contacts a solid adhesive polymer layer. It will be understood that the arrangement shown is illustrative of the versatility of laminated circuits made according to the invention, and a variety of other circuits and interconnection assemblies may be implemented in similar fashion.

For preferred solid adhesive polymer layer materials, simple contact and mild pressure will be sufficient for the solid adhesive polymer layer to wet another ply of the laminate. This is especially the case where each flexible polymer substrate has a solid adhesive polymer layer. In some cases, heating may be desirable to "cure" the solid adhesive polymer layer. Another alternative is to add a UV photoinitiator to the solid adhesive polymer layer, and use UV radiation, typically in the form of UV lamps, to cross-link the polymer(s) in the solid adhesive polymer layer layers.

Figure 16:
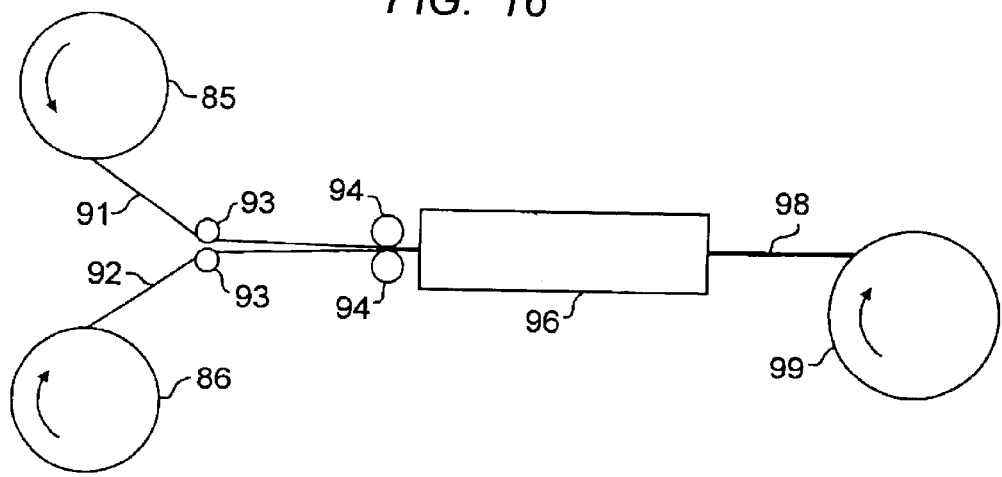
FIG. 16 is a schematic representation of a reel-to-reel assembly operation for the manufacture of flexible TFT tapes.

As mentioned earlier, it would be desirable to have a simple and reliable lamination method that allows implementation of reel-to-reel manufacturing methods. A schematic arrangement for achieving reel-to-reel assembly of the laminations is illustrated in FIG. 16. Reels 85 and 86 carry two plies of a laminated TFT tape 91 and 92. The tapes are reeled through control and alignment spools 93, which may actually involve many spools, for handling the tape. The two plies are fed into rollers 94 that press the two plies together. The unified tape is shown guided through curing station 96, which is optional and in the preferred case is not used. In cases where it is used it will typically provide heat or UV radiation. The laminated tape 98 is then reeled onto take-up drum 99.

Figure 17:
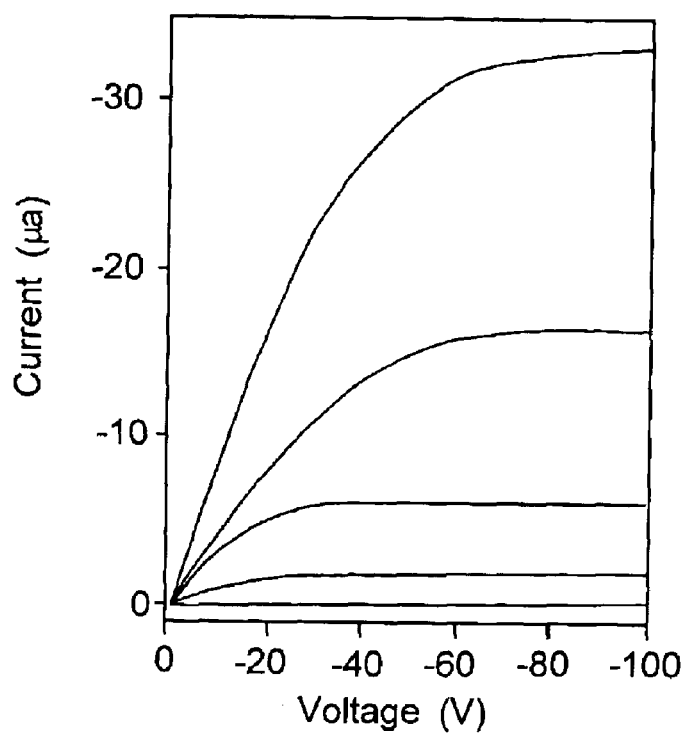
FIG. 17 is an IV characteristic for an organic thin film transistor with electrodes formed by the nTP method of the invention.
Figure 18:
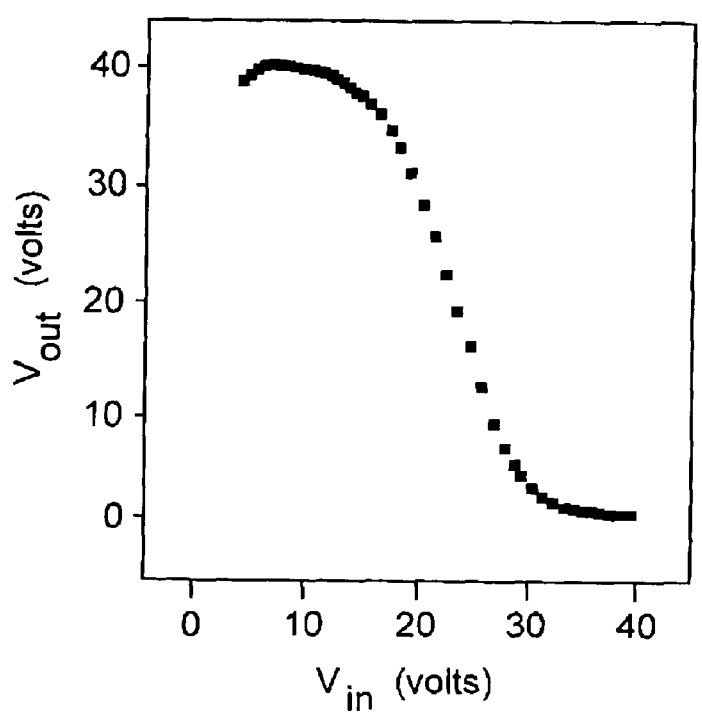
FIG. 18 is an IV characteristic for an inverter circuit with electrodes formed by the nTP method of the invention.

FIGS. 17 and 18 give IV-characteristics of an organic transistor (FIG. 17) and a complementary inverter circuit (FIG. 18) with printed electrical contacts made using the nTP method of the invention. The performance characteristics (e.g, mobility, on/off ratio, sub-threshold slope, threshold voltage, etc.) are consistent with measurements on larger scale transistors fabricated by traditional means.

Examples of suitable materials for the metal transfer layer are given above. Other metals and metal combinations having these properties may be used alternatively. The characteristics desired include a metal that adheres poorly to a stamp surface but adheres well to a device substrate. (A device substrate is a substrate that is part of the finished electrical device. Here it should be pointed out that the invention is not limited to forming patterns for electrical devices.) The preferred characteristics also include a metal that may be surface activated, for example by exposure of the surface to an oxygen plasma, to produce an activated surface. An activated surface is one that includes dangling bonds, typically hydroxyl bonds, that readily attach to another activated surface by a chemical reaction. The (poor) adhesion of the metal transfer layer to the stamp surface is characterized by the relative absence of chemical bonds between the metal transfer layer and the stamp surface. The (good) adhesion of the metal transfer layer to the device substrate is characterized by chemical bonding between the metal and the surface of the device substrate. Since it is usually the case that two different materials will provide these properties optimally, the metal transfer layer in the preferred case will be a bi-layer of two metals. Tri-layers may also be found suitable. Patterns of metal alloys may also be printed using the techniques of the invention. Alloy metal layers may be produced by a variety of techniques such as co-sputtering or co-evaporation. Other materials, not technically considered metals, may be patterned as well, for example, indium tin oxide, TaN, $Si_3N_4$, $SiO_2$. The same materials may be used on the surface to which the transfer layer is applied. The surface of either or both of the layers, i.e. the surface of the transfer layer or the surface of the receiving layer (device substrate), or both, may be activated.

In the example given above, the surface chemistry involves activating by producing dangling hydroxyl groups on one or both of the transfer surfaces. In the specific embodiment, those groups are produced by treatment with an oxygen plasma. Other ways of activating one or both transfer surfaces may also be used. For example, exposing a silicon wafer to a silane solution (3-mercaptopropyltrimethoxysilane) produces an activated surface with exposed thiol end groups. This allows nTP on the silicon substrate. Sulfur-gold bonds form when the thiol activated silicon surface is brought into contact with an Au-coated (20 nm) PDMS stamp. For other details on this activation mechanism see Nuzzo, R. G. & Dubois, L. G. Ann. Rev. Phys. Chem. 43, 437–463 (1992).

While the transfer techniques of the invention is particularly suited for the manufacture of TFT devices, and the specific examples presented are mainly in that context, a wide variety of microdevices may be produced using these transfer techniques. For example, capacitors, inductors, LC circuits, and any kind of device using metallization patterns for interconnection may take advantage of the invention. As mentioned above, patterns of materials other than metals or conductors may be made using the transfer technique of the invention. Thus for example, LC networks may be produced simply and inexpensively by printing two plies of metal patterns, then printing the capacitor dielectrics on one or both of the plies. The plies are then laminated together.

Reference is made above to photolithography and photoresist. It should be understood that any form of lithography, including x-ray and e-beam, and any suitable material that can be patterned using actinic radiation, may be substituted.

The foregoing description focuses on printed elemental metal patterns. Patterns of metal alloys may also be printed using the techniques of the invention. Alloy metal layers may be produced by a variety of techniques such as co-sputtering or co-evaporation. Other materials, for example, indium tin oxide, TaN., not technically considered metals, may function as the transfer layer or part of the transfer layer.

The forming the patterned thin films of the invention the actual pattern may be either on the stamp of the substrate. Embossed patterns may be produced using the invention by forming a raised pattern on a substrate, and bringing the patterned substrate into contact with a plane layered stamp.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for forming a thin film pattern on a surface of a substrate comprising:
   depositing a transfer layer on the surface of a patterned stamp, the transfer layer having an upper surface and a lower surface, with the lower surface contacting the surface of the patterned stamp;
   treating one or both of the upper surface of the transfer layer and the surface of the substrate to activate the one or both thereof; and
   placing the upper surface of the transfer layer and the surface of the substrate in contact to transfer the transfer layer from the patterned stamp to the substrate.
2. The method of claim 1 wherein the transfer layer is a metal transfer layer comprising a metal.
3. The method of claim 2 wherein the patterned stamp has features with an edge resolution of less than 100 nm.
4. The method of claim 3 wherein the features have a size of less than 100 microns.
5. The method of claim 2 wherein the metal transfer layer comprises a bi-layer of two metals.
6. The method of claim 5 wherein the bi-layer comprises gold and titanium.
7. The method of claim 5 wherein the bi-layer comprises a gold layer in contact with the pattern layer.
8. The method of claim 5 wherein the bi-layer comprises a first metal layer on the surface of the stamp, and a second metal layer on the first metal layer, and wherein the second metal layer has greater adhesion to the substrate than the first metal has to the surface of the stamp.
9. The method of claim 8 wherein the transfer of the metal transfer layer from the stamp surface to the substrate occurs with the formation of chemical bonds between the second metal layer and the substrate.
10. The method of claim 2 wherein the stamp is a resilient polymer stamp.
11. The method of claim 10 wherein the resilient polymer stamp is prepared by the steps comprising:
    a. forming a master mold by:
       i. forming a pattern layer on a substrate;
       ii. patterning the pattern layer by forming a pattern of openings through the pattern layer;
    b. applying a prepolymer of the resilient polymer to the master mold;
    c. curing the prepolymer; and
    d. removing the resilient polymer, leaving a pattern of raised portions on the surface of the resilient polymer.
12. The method of claim 11 wherein the pattern layer is sensitive to actinic radiation, and the pattern is formed using lithography.
13. The method of claim 11 wherein the resilient polymer is PDMS.
14. The method of claim 2 wherein the stamp is a rigid stamp.
15. The method of claim 14 wherein the rigid stamp is prepared by steps comprising:
    a. forming a pattern layer on a stamp substrate; and
    b. patterning the pattern layer by forming a pattern of openings through the pattern layer.
16. The method of claim 15 wherein the pattern layer comprises a material selected from the group consisting of glass, silicon, GaAs, polyester, and polyacrylate.
17. The method of claim 2 wherein a surface of the metal transfer layer is activated by exposing the surface of the metal transfer layer to an oxygen plasma.
18. The method of claim 2 wherein a surface of the substrate is activated.
19. The method of claim 18 wherein a surface of the substrate is activated by exposing the surface to an oxygen plasma.
20. The method of claim 2 wherein the substrate comprises a resilient polymer.
21. The method of claim 2 wherein the substrate is rigid.
22. The method of claim 2 wherein the upper surface of the transfer layer and the surface of the substrate are placed in contact with a pressure below 50 psi.
23. The method of claim 1 wherein the transfer layer comprises a non-metal.
24. The method of claim 23 wherein the non-metal is selected from the group consisting of $Si_3N_4$, $SiO_2$, indium tin oxide, and TaN.
25. A method for forming a thin film metal pattern on a surface of a substrate comprising the steps of:
    preparing the substrate by forming a raised pattern on the surface of the substrate;
    preparing a stamp by steps comprising depositing a metal transfer layer on the surface of the stamp, the metal transfer layer having an upper surface and a lower surface, with the lower surface contacting the surface of the stamp;
    treating one or both of the upper surface of the transfer layer and the surface of the substrate to activate the one or both thereof; and
    placing the upper surface of the transfer layer and the surface of the substrate in contact to transfer the metal transfer layer from the stamp surface to the raised pattern on the substrate.
26. The method of claim 25 wherein the upper surface of the transfer layer and the surface of the substrate are placed in contact with a pressure below 50 psi.

* * * * *